(12) United States Patent
Gambino et al.

(10) Patent No.: US 7,537,951 B2
(45) Date of Patent: May 26, 2009

(54) IMAGE SENSOR INCLUDING SPATIALLY DIFFERENT ACTIVE AND DARK PIXEL INTERCONNECT PATTERNS

(75) Inventors: Jeffrey P. Gambino, Westford, VT (US); Mark D. Jaffe, Shelburne, VT (US); Robert K. Leidy, Burlington, VT (US); Richard J. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 11/560,019

(22) Filed: Nov. 15, 2006

(65) Prior Publication Data

US 2008/0111159 A1    May 15, 2008

(51) Int. Cl.
*H01L 21/00* (2006.01)
(52) U.S. Cl. ........................................ 438/48
(58) Field of Classification Search ............... 438/48, 438/128, 149, 152; 257/59, 72, 359, 69, 257/E27.122
See application file for complete search history.

(56) References Cited

U.S. PATENT DOCUMENTS

| | | | |
|---|---|---|---|
| 6,566,160 B2 * | 5/2003 | Yeh et al. | 438/70 |
| 2003/0052982 A1 | 3/2003 | Chieh | |
| 2003/0146994 A1 | 8/2003 | Kokubun | |
| 2005/0056902 A1 | 3/2005 | Abe et al. | |
| 2005/0139828 A1 | 6/2005 | Maruyama et al. | |
| 2005/0243193 A1 | 11/2005 | Gove et al. | |
| 2007/0238034 A1 * | 10/2007 | Holscher, Jr. | 430/7 |
| 2008/0087921 A1 * | 4/2008 | Yu et al. | 257/213 |
| 2008/0117319 A1 * | 5/2008 | Jiang et al. | 348/273 |

* cited by examiner

*Primary Examiner*—Nathan W Ha
(74) *Attorney, Agent, or Firm*—Scully, Scott, Murphy & Presser, P.C.; Anthony J. Canale

(57) ABSTRACT

An interconnect layout, an image sensor including the interconnect layout and a method for fabricating the image sensor each use a first electrically active physical interconnect layout pattern within an active pixel region and a second electrically active physical interconnect layout pattern spatially different than the first electrically active physical interconnect layout pattern within a dark pixel region. The second electrically active physical interconnect layout pattern includes at least one electrically active interconnect layer interposed between a light shield layer and a photosensor region aligned therebeneath, thus generally providing a higher wiring density. The higher wiring density within the second layout pattern provides that that the image sensor may be fabricated with enhanced manufacturing efficiency and a reduction of metallization levels.

7 Claims, 4 Drawing Sheets

IMAGE SENSOR INCLUDING SPATIALLY DIFFERENT ACTIVE AND DARK PIXEL INTERCONNECT PATTERNS

BACKGROUND

1. Field of the Invention

The invention relates generally to pixels within image sensors. More particularly, the invention relates to interconnect patterns within pixels within image sensors.

2. Description of Related Art

Semiconductor image sensors, including complementary metal oxide semiconductor (CMOS) image sensors and charge coupled device (CCD) image sensors, are gaining in popularity. In general, semiconductor image sensors are used as imaging components within various types of consumer and industrial products. Non-limiting examples of applications for image sensors include scanners, photocopiers, digital cameras and video telecommunications devices. CMOS image sensors provide advantages in comparison with other types of semiconductor image sensors insofar as CMOS image sensors are generally less expensive to fabricate. CMOS image sensors also generally consume less power.

Image sensors typically comprise an array of pixels that in turn comprises an array of photosensors located within a semiconductor substrate. The photosensors are often photodiodes. Aligned over the array of photosensors is an array of lens structures (or lens layers) that is used to capture incoming light that is representative of an object desired to be imaged. Interposed between the array of photosensors and the array of lens structures are spacer layers and color filter layers that allow for color discrimination and focusing of incoming light.

Image sensors also typically include dark pixels (i.e., pixels from which light is excluded) in addition to active pixels (i.e., pixels that are actively used within an imaging application). An electrical output from a dark pixel is typically used to determine a background response of a pixel, for purposes of electrical correction for active pixel output within the image sensor.

Pixel dimensions within image sensors are certain to continue to decrease and such decreased pixel dimensions within image sensors are likely to lead to a need for more efficient image sensor structures and methods for fabrication thereof. Included are sensors that include dark pixel correction. Thus, desirable are image sensors, and methods for fabrication thereof, that efficiently provide for dark pixel correction.

SUMMARY OF THE INVENTION

The invention includes an interconnect wiring pattern for a sensor array, the sensor array that includes the interconnect wiring pattern and a method for fabricating the sensor array. Within the interconnect pattern, sensor array and method for fabrication thereof, a first electrically active interconnect wiring pattern is used within an active pixel region and a second electrically active interconnect wiring pattern spatially different from the first electrically active interconnect wiring pattern is used within a dark pixel region.

The second electrically active interconnect wiring pattern includes at least one interconnect layer that if included within the first electrically active interconnect pattern would be within a light path.

Within the embodiment and the invention, an "electrically active" interconnect wiring pattern is intended to exclude portions of wiring patterns that are used in light shield layers within dark pixel regions. "Electrically active" interconnect wiring patterns are thus in general also intended to primarily include portions of wiring patterns that are actively used in electrical signal sensing or propagation.

Within the embodiment and the invention, "spatially different" with respect to a comparison of a first electrically active wiring pattern used within an active pixel region and a second electrically active wiring pattern used within a dark pixel region is intended to indicate a different geometric arrangement of wiring layers within the first electrically active wiring pattern and the second electrically active wiring pattern. The different geometric arrangement may include, but is not limited to a density of wiring layers, a separation distance of wiring layers and a specific spatial location of wiring layers.

An interconnect layout (i.e., wiring pattern) for a sensor array in accordance with the invention includes a first electrically active physical interconnect pattern located within a plurality of active pixels. The interconnect layout also includes a second electrically active physical interconnect pattern spatially different from the first electrically active physical interconnect pattern located within a plurality of dark pixels. The second electrically active physical interconnect pattern includes at least one interconnect layer not included within the first electrically active physical interconnect pattern that would be spatially located in a light path if included within the first electrically active physical interconnect pattern.

An image sensor in accordance with the invention includes a plurality of photosensor regions located within a substrate. The image sensor also includes a multi-layer interconnect layer located over the substrate including the plurality of photosensor regions. The multi-layer interconnect layer comprises a first electrically active pattern within a plurality of active pixel regions and a second electrically active pattern spatially different from the first electrically active pattern within a plurality of dark pixel regions. Within the image sensor, the second electrically active pattern comprises at least one interconnect layer not included within the first electrically active pattern that would be spatially located in a light path if included within the first electrically active pattern.

A method for fabricating an image sensor in accordance with the invention includes forming a multi-layer interconnect layer over a substrate comprising a plurality of photosensor regions. The method provides that the plurality of photosensor regions comprises a plurality of dark pixels and a plurality of active pixels. The method also provides that the multi-layer interconnect layer has a first electrically active pattern with respect to the plurality of active pixels and a second electrically active pattern spatially different from the first electrically active pattern with respect to the plurality of dark pixels. Within the method, the second electrically active pattern comprises at least one interconnect layer not included within the first electrically active pattern that would be spatially located in a light path if formed within the first electrically active pattern

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The instant invention, which includes an interconnect layout (i.e., wiring pattern) for use within an image sensor, the image sensor that includes the interconnect layout and a method for fabricating the image sensor, will be described in further detail within the context of the following description. The description is further understood within the context of the drawings described above. The drawings are intended for illustrative purposes and as such the drawings are not necessarily drawn to scale.

Figure 1:
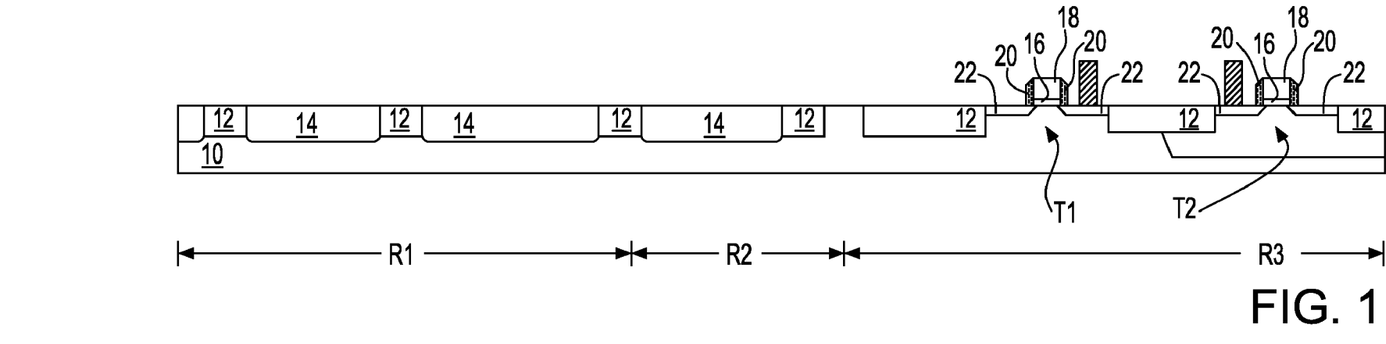
FIG. 1 to FIG. 6 show a series of schematic cross-sectional diagrams illustrating the results of progressive stages in fabricating a CMOS image sensor in accordance with an embodiment of the invention.

FIG. 1 to FIG. 6 show a series of schematic cross-sectional diagrams illustrating the results of progressive stages in fabricating a CMOS image sensor in accordance with an embodiment of the invention. FIG. 1 in particular shows a schematic cross-sectional diagram of the CMOS image sensor at an early stage in the fabrication thereof in accordance with the embodiment.

FIG. 1 shows a semiconductor substrate 10. A counter-doped well 11 (having a conductivity type different from the semiconductor substrate 10) is located within the semiconductor substrate 10. A series of isolation regions 12 is also located within the semiconductor substrate 10. The semiconductor substrate 10 comprises a first region R1 that comprises an active pixel region, a laterally adjacent second region R2 that comprises a dark pixel region and a further laterally adjacent third region R3 that comprises a circuitry region.

The semiconductor substrate 10 may comprise any of several semiconductor materials. Non-limiting examples of semiconductor materials include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a thickness from about 1 to about 3 mils.

Within the first region R1 and the second region R2, the series of isolation regions 12 separates a series of photosensor regions 14. Within the third region R3, the series of isolation regions 12 separates a plurality of active regions. The active regions within the circuitry region include a first field effect transistor T1 and a second field effect transistor T2 located and fabricated therein. The field effect transistors T1 and T2 comprises a pair of CMOS transistors, since transistor T1 is located and fabricated within the semiconductor substrate 10 and transistor T2 is located and fabricated within the doped well 11 (having different conductivity type than the semiconductor substrate 10).

Within the first region R1, the second region R2 and the third region R3, the series of isolation regions 12 may comprise materials, have dimensions and be formed using methods that are otherwise generally conventional in the semiconductor fabrication art.

The isolation regions 12 may include, but are not limited to, local oxidation of silicon (LOCOS) isolation regions, shallow trench isolation regions (i.e., having a depth up to about 5000 angstroms) and deep trench isolation regions (i.e., having a depth up to about 60000 angstroms). Typically, the embodiment uses shallow trench isolation regions that are located within shallow isolation trenches. The isolation regions 12 (whether located within shallow isolation trenches or deep isolation trenches) may comprise any of several dielectric materials. Typically included are oxides, nitrides and oxynitrides of silicon, as well as laminates thereof and composites thereof. Oxides, nitrides and oxynitrides of other elements are not excluded.

Typically, the dielectric materials which may comprise the isolation regions 12 are formed at least in part using a blanket layer deposition and planarizing method. Appropriate blanket layers may be formed using methods including but not limited to thermal or plasma oxidation or nitridation methods, chemical vapor deposition methods and physical vapor deposition methods. Planarization methods may include, but are not limited to mechanical planarizing methods and chemical mechanical polish (CMP) planarizing methods. Chemical mechanical polish planarizing methods are most common. Typically the isolation regions 12 comprise at least in part a silicon oxide material that has a thickness from about 1000 to about 5000 angstroms.

Within the first region R1 and the second region R2, each of the photosensor regions 14 may comprise photosensors that are otherwise generally conventional in the semiconductor fabrication art. Each of the photosensor regions 14 typically comprises a photodiode, although the invention is not limited to a photosensor region 14 using only a photodiode. As noted above, charge coupled devices are also known to be used within photosensors. Typically, the photodiode (if used) is doped to a concentration from about 1e16 to about 1e18 dopant atoms per cubic centimeter, while using an appropriate dopant. The photosensor region 14 plan-view linewidths (in both directions) are typically from about 6.0 to about 1.5 microns.

Within the third region R3, each of the field effect transistors T1 and T2 comprises a gate dielectric 16 located upon the semiconductor substrate 10. A gate 18 is located aligned upon the gate dielectric 16, although such alignment is not necessarily a feature of the invention. A plurality of spacers 20 (illustrated as plural layers in cross-section but intended as single layers that surround the individual gates 18 in plan-view) is located adjoining the sidewalls of the gate dielectrics 16 and the gates 18. Finally, each of the first transistor T1 and the second transistor T2 comprises a pair of source/drain regions 22 separated by a channel region located beneath a corresponding gate 18.

Each of the foregoing layers and structures that comprise the first transistor T1 and the second transistor T2 may comprise materials and have dimensions that are conventional in the semiconductor fabrication art. Each of the foregoing layers and structures that comprise the first transistor T1 and the second transistor T2 may also be formed using methods that are conventional in the semiconductor fabrication art.

The gate dielectrics 16 may comprise any of several gate dielectric materials. Included but not limiting are generally lower dielectric constant gate dielectric materials such as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant gate dielectric materials may include, but are not limited to hafnium oxides, hafnium silicates, titanium oxides, lanthanum oxides, barium-strontium titanates (BSTs) and lead-zirconate titanates (PZTs).

The foregoing gate dielectric materials may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods (including sputtering methods). Typically, the gate dielectrics 16 comprise a thermal silicon oxide gate dielectric material having a thickness from about 20 to about 70 angstroms.

The gates 18 may similarly also comprise any of several gate conductor materials. Non-limiting examples include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. The gate conductor materials may be formed using any of several methods. Non-limiting examples include chemical vapor deposition methods (also including atomic layer chemical vapor deposition methods) and physical vapor deposition methods (including sputtering methods). Typically, each of the gates 18 comprises a doped polysilicon material having a thickness from about 1000 to about 1500 angstroms.

The spacers 20 typically comprise a dielectric spacer material or a laminate of dielectric spacer materials, although spacer layers comprising conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods used for forming the gate dielectrics 16. Typically, the spacers 20 are formed using a blanket layer deposition and etchback method that provides the spacers 20 with the characteristic inward pointed shape.

The source/drain regions 22 are typically formed using a two-step ion implantation method. The source/drain regions 22 are implanted with a dopant of polarity appropriate to a polarity of a field effect transistor within which they are formed. The two-step ion implantation method uses a gate 18, with and without a spacer 20, as a mask. Typical concentrations of dopants within the source/drain regions 22 are from about 1e15 to about 1e22 dopant atoms per cubic centimeter.

Reference numerals for the gate dielectrics 16, the gates 18, the spacers 20 and the source/drain regions 22 for the first transistor T1 and the second transistor T2 are illustrated specifically in FIG. 1. However, for clarity the reference numerals 16/18/20/22 are largely omitted within subsequent cross-sectional diagrams, although the first transistor and the second transistor are still designated as T1 and T2.

Figure 2:
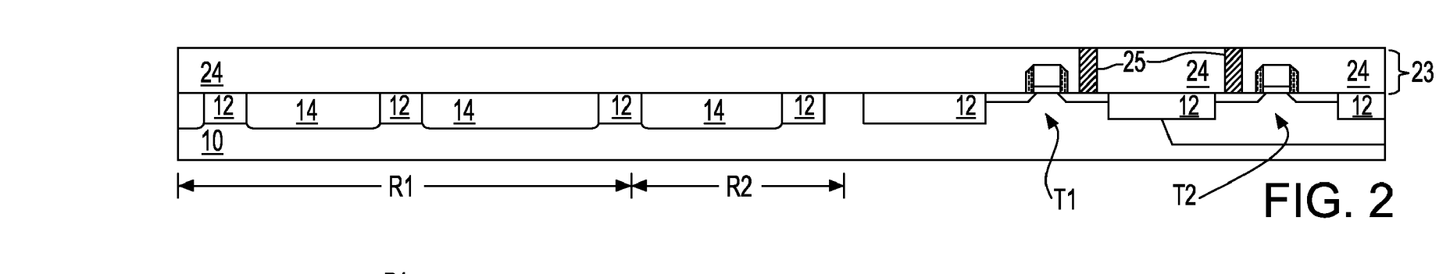

FIG. 2 shows the results of further processing of the CMOS image sensor whose schematic cross-sectional diagram is illustrated in FIG. 1.

FIG. 2 shows a dielectric/contact stud layer 23 located upon the CMOS image sensor whose schematic cross-sectional diagram is illustrated in FIG. 1. The dielectric/contact stud layer 23 comprises a dielectric layer 24 and a plurality of contact studs 25.

The dielectric layer 24 may comprise any of several dielectric materials. Included but not limiting are oxides, nitrides and oxynitrides of silicon. Oxides, nitrides and oxynitrides of other elements are not excluded. Also included are crystalline as well as amorphous dielectric materials. Further included are: (1) comparatively dense dielectric materials such as silicon oxides, silicon nitrides and silicon oxynitrides deposited using chemical vapor deposition methods and physical vapor deposition methods (i.e., having a generally higher dielectric constant in a range from about 4 to about 20); as well as (2) comparatively less dense or porous dielectric materials such as spin-on-glass and spin-on-polymer dielectric materials (having a generally lower dielectric constant in a range from about 2.5 to about 4). The dielectric materials may be formed using any of several methods. Included are thermal or plasma oxidation or nitridation methods, chemical vapor deposition methods, physical vapor deposition methods and spin-on methods. Typically, the dielectric layer 24 comprises at least in part a silicon oxide material having a thickness from about 3000 to about 9000 angstroms.

The contact studs 25 may comprise any of several conductor materials. Included but not limiting are certain metals, metal alloys, doped polysilicon and polycide conductor materials. Metals such as tungsten, aluminum and copper are generally common conductor materials. The conductor stud materials may be deposited using methods that are appropriate to their materials of composition. Included are plating methods, chemical vapor deposition methods and physical vapor deposition methods. Typically, the contact studs 25 comprise a tungsten conductor material for purposes of effecting optimal electrical contact and conduction to the first transistor T1 and the second transistor T2.

To fabricate the dielectric/contact stud layer 23 that is illustrated in FIG. 2 upon the semiconductor structure whose schematic cross-sectional diagram is illustrated in FIG. 1, a blanket precursor layer to the dielectric layer 24 is first formed upon the semiconductor structure of FIG. 1. This precursor dielectric layer is then patterned to expose a source/drain region 22 within each of the first transistor T1 and the second transistor T2. Finally, a blanket tungsten layer (or alternatively another conductor material layer) is deposited and located upon the resulting patterned dielectric layer 24 and planarized to form the contact studs 25. The planarization may be effected using methods including but not limited to purely mechanical planarizing methods, as well as chemical mechanical polish planarizing methods. Chemical mechanical polish planarizing methods are generally more common, but they do not limit the invention.

Figure 3:
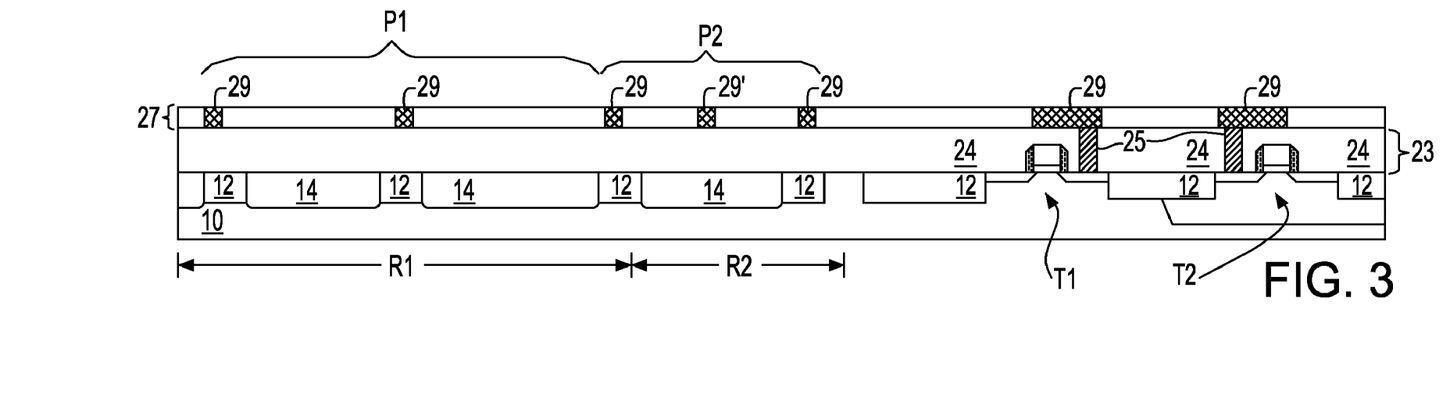

FIG. 3 shows a dielectric/interconnect layer 27 located upon the semiconductor structure whose schematic cross-sectional diagram is illustrated in FIG. 2. The dielectric/interconnect layer 27 comprises a dielectric layer 28 and a plurality of interconnect layers 29 and 29'. The plurality of interconnect layers 29 and 29' has a different spatial pattern P1 (i.e., a less dense spatial pattern) within the region R1 that comprises the active pixels than a spatial pattern P2 (i.e., a more dense spatial pattern) within the region R2 that comprises the dark pixel. The spatial pattern P1 does not include any interconnect layers 29 or 29' within a light path with respect to a photosensor region 14 within the region R1 comprising the active pixels. The spatial pattern P2 does include an interconnect layer 29' that is nominally centered above the photosensor region 14 within the region R2 comprising the dark pixel. Interconnect layer 29' is thus clearly within a light path with respect to the photosensor region 14 within the region R2 comprising the dark pixel, and interconnect layer 29' would be within a light path with respect to one of the photosensor regions 14 within the region R1 comprising the active pixels if included within the pattern P1.

The dielectric layer 28 may comprise dielectric materials and be formed using methods similar to the materials and methods that are used within the context of the dielectric layer 24. The interconnect layers 29 and 29' may comprise any of the several conductor materials from which may be comprised the contact studs 25. Typically the interconnect layers 29 and 29' comprise copper conductor materials, although the invention is not so limited. Typically, the dielectric/interconnect layer 27 has a thickness from about 1000 to about 5000 angstroms.

The dielectric/interconnect layer 27 may be formed using methods that are generally analogous to the methods used for forming the dielectric/contact stud layer 23. In particular, a precursor layer to the dielectric layer 28 is formed and patterned to form the dielectric layer 28. A blanket interconnect conductor layer is then formed and located upon the dielectric layer 28 and planarized to form the interconnect layers 29 and 29'.

Figure 4:
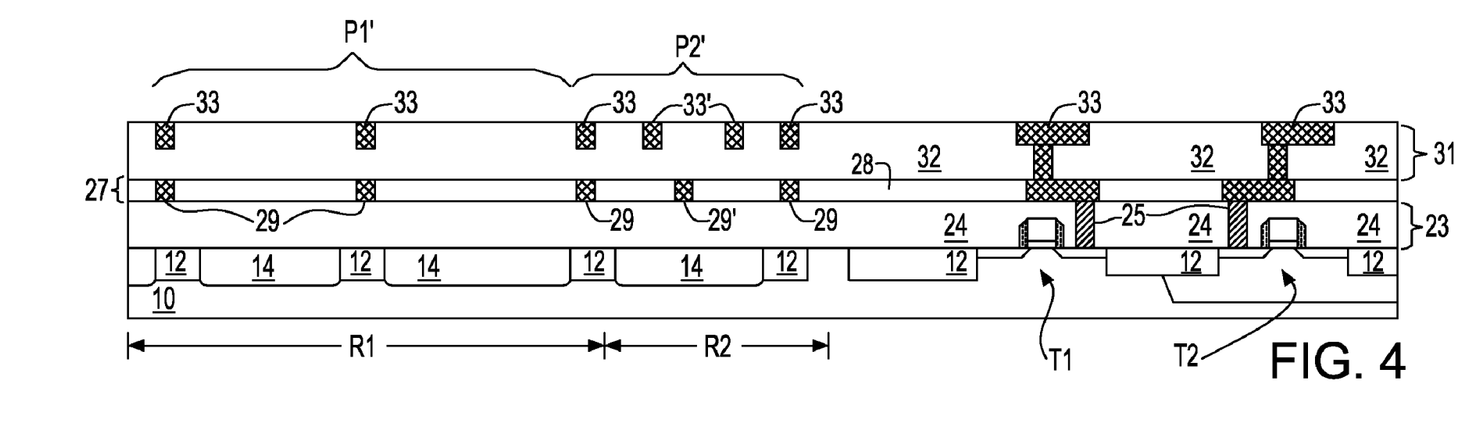

FIG. 4 shows a dielectric/stud-interconnect layer 31 located upon the dielectric/interconnect layer 27 illustrated within the schematic cross-sectional diagram of FIG. 3. The dielectric/stud-interconnect layer 31 comprises dielectric layer 32 and stud-interconnect layers 33 and 33', some of which are not of appropriate cross-section to illustrate stud portions of stud-interconnect layers 33 and 33'. The dielectric layer 32 may comprise materials and be formed using methods generally analogous to the materials and methods used for forming the dielectric layers 28 and 24. The stud-interconnect layers 33 and 33' may comprise materials and be formed using methods generally analogous to the materials and methods used for forming the interconnect layers 29 and 29' or the stud layers 25.

More particularly, the methods for forming the stud-interconnect layers 33 and 33' will comprise dual damascene methods rather than the single damascene methods disclosed above within the context of forming the interconnect layers 29 and 29" within the dielectric/interconnect layer 27 and the stud layers 25 within the dielectric/stud layer 23.

Such a dual damascene method first provides for forming a contiguous trench and via within a precursor layer to the dielectric layer 32. Either the trench or the via may be formed first. A blanket stud-interconnect material layer (i.e., typically copper, but the invention is not so limited) is then formed to fill the via and the trench. The blanket stud-interconnect material layer is then planarized to form the stud-interconnect layers 33 and 33'. Typically the dielectric/stud-interconnect layer 31 has a thickness from about 3000 to about 9000 angstroms.

As is illustrated in FIG. 4, the stud-interconnect layers 33 and 33' also have a different spatial pattern P1' in the first region R1 comprising the active pixels, in comparison with a spatial pattern P2' in the second region R2 comprising the dark pixel. In particular none of the stud-interconnect layers 33 or 33' is within a light path with respect to the photosensor regions 14 within the first region R1 comprising the active pixels. However, stud-interconnect layers 33' are located within a light path with respect to the photosensor region 14 within the second region R2 comprising the dark pixel.

Thus, within the context of the schematic cross-sectional diagrams of FIG. 3 and FIG. 4, the embodiment provides interconnect wiring layers (i.e., interconnect layer 29' and stud-interconnect layers 33') that are located within a light path with respect to the photosensor region 14 within the region R2 comprising the dark pixel. The embodiment also provides that similar wiring layers (i.e., interconnect layers 29 and stud-interconnect layers 33) are not located within a light path with respect to the photosensor regions 14 within the first region R1 comprising the active pixels.

Figure 5:
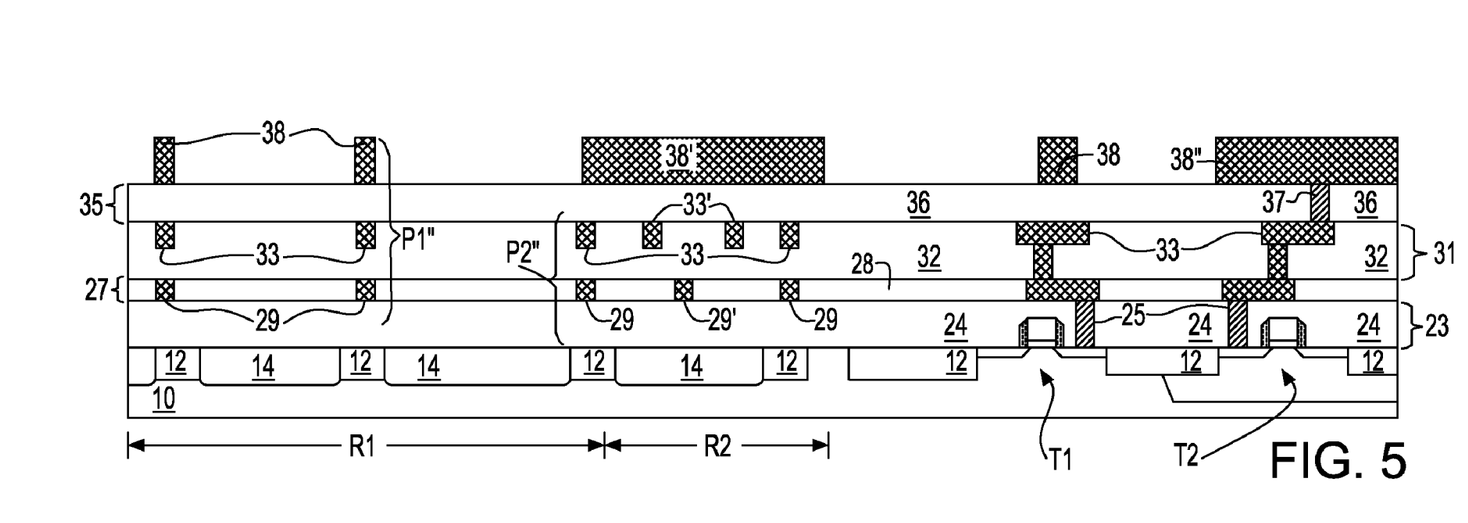

FIG. 5 shows a schematic cross-sectional diagram illustrating the results of further processing of the semiconductor structure of FIG. 4.

FIG. 5 first shows dielectric/terminal stud layer 35 located upon the dielectric/stud-interconnect layer 31. The dielectric/terminal stud layer 35 comprises a dielectric layer 36 and a terminal stud layer 37.

The dielectric layer 36 may comprise materials and be formed using methods that are analogous, equivalent or identical to the materials and methods used for forming the dielectric layers 32, 28 and 24. The stud layer 37 may comprise materials and be formed using methods, analogous, equivalent or identical to the materials and methods used for forming the stud layers 25. Typically, the dielectric/terminal stud layer 35 has a thickness from about 2000 to about 6000 angstroms.

FIG. 5 also shows a plurality of interconnect layers 38, a light shield layer 38' and a bond pad 38" located upon the dielectric/terminal stud layer 35. In particular, the bond pad 38" contacts the terminal stud 37. The interconnect layers 38, the light shield layer 38' and the bond pad 38" are typically patterned from a single blanket metal layer. Metals from which may be comprised the blanket metal layer include but are not limited to aluminum, copper and tungsten. Aluminum is more common, since aluminum is often desirable as a bond pad material. The invention is not so limited. Typically, each of the interconnect layers 38, the light shield layer 38' and the bond pad 38" has a thickness from about 2000 to about 9000 angstroms.

Within the schematic cross-sectional diagram of FIG. 5, all conductor layers other than the light shield 38' (i.e., contact studs 25, interconnect layers 29 and 29', stud-interconnect layers 33 and 33', terminal stud layer 37, interconnect layers 38 and bond pad 38") are intended as electrically active layers. Thus, FIG. 5 shows a schematic cross-sectional diagram of a CMOS image sensor having an electrically active first physical interconnect pattern P1" within the region R1 comprising the active pixels that is spatially different from an electrically active second physical interconnect pattern P2" within the region R2 comprising the dark pixel.

The electrically active second physical interconnect pattern P2" includes the interconnect layer 29' and the stud-interconnect layers 33' interposed between the light shield 38' and the photosensor region 14 within the region R2 comprising the dark pixel. The interconnect layer 29' and the stud-interconnect layers 33' would thus be within a light path within the region R2 comprising the dark pixel, but for the presence of the light shield 38'. The interconnect layer 29' and the stud-interconnect layers 33' are not included within the electrically active first physical interconnect pattern P1" within the first region R1 comprising the active pixels, but would be within a light path with respect to a photosensor region 14 if included within the electrically active first physical interconnect pattern P1".

By locating the interconnect layer 29' and the stud-interconnect layers 33' within the space available interposed between the light shield 38' and the photosensor region 14 within the region R2 comprising the dark pixel, the CMOS image sensor whose schematic cross-sectional diagram is illustrated in FIG. 5 provides for enhanced flexibility in the design and implementation of interconnect circuitry. The use of the space available interposed between the light shield 38' and the photosensor 14 within the region R2 comprising the dark pixel for additional interconnect circuitry also potentially allows for use of a lesser number of metallization levels (i.e., a number of vertical metallization layers) when fabricating a CMOS image sensor.

Figure 6:
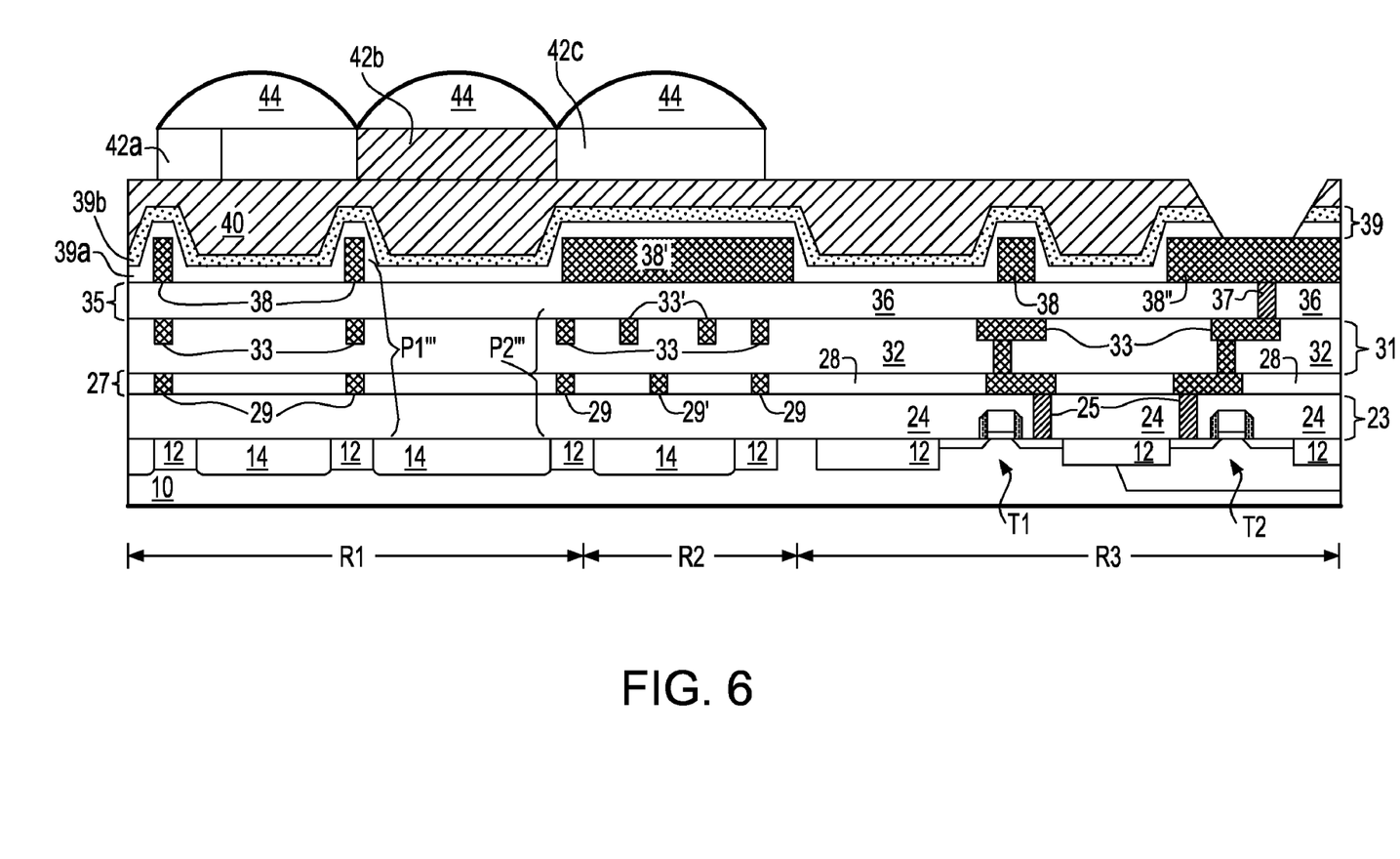

FIG. 6 shows the results of further processing of the CMOS image sensor whose schematic cross-sectional diagram is illustrated in FIG. 5.

FIG. 6 first shows a passivation layer 39 located conformally upon the semiconductor structure of FIG. 5. The passivation layer 39 passivates the interconnect layers 38, the light shield 38' and the bond pad 38". Located upon the passivation layer 39 is a planarizing layer 40.

The passivation layer 39 typically comprises a bilayer of materials, as is illustrated within FIG. 6. The bilayer typically comprises a lower layer 39a predominantly comprising an oxide material and an upper layer 39b predominantly comprising a nitride material. The oxide material and the nitride material may be formed using methods analogous to the methods used for forming underlying dielectric layers 36/32/28/24 within the CMOS image sensor that is illustrated in FIG. 6. Typically, the lower layer 39a has a thickness from about 500 to about 5000 angstroms and the upper layer 39b has a thickness from about 500 to about 5000 angstroms.

The planarizing layer 40 may comprise any of several optically transparent planarizing materials. Non-limiting examples include spin-on-glass planarizing materials and spin-on-polymer planarizing materials that may include, but are not limited to spin-on-polymers such as but not limited to photoresist materials. Typically, the planarizing layer 40 has a thickness sufficient to at least planarize the interconnect layers 38, the light shield 38' and the bond pad 38", thus providing a planar surface for fabrication of additional structures within the CMOS image sensor whose schematic cross-sectional diagram is illustrated in FIG. 6. Typically, the planarizing layer 40 has a thickness from about 2000 to about 9000 angstroms within the context of the foregoing planarization limitations.

FIG. 6 also shows a plurality of color filter layers 42a, 42b and 42c located upon the planarizing layer 40. Each of the plurality of color filter layers 42a, 42b and 42c is aligned and registered with respect to one of the photosensor regions 14.

The color filter layers 42a, 42b and 42c will typically include either the primary colors of red, green and blue, or the complementary colors of yellow, cyan and magenta. The color filter layers 42a, 42b and 42c typically comprise a series of dyed or pigmented patterned photoresist layers that is intrinsically imaged to form the series of color filter layers 42a, 42b and 42c. Alternatively, the color filter layers 42a, 42b and 42c may comprise dyed or pigmented organic polymer materials that are otherwise optically transparent, but extrinsically imaged while using an appropriate mask layer. Alternative color filter materials may also be used.

FIG. 6 finally shows a plurality of lens layers 44 located upon the color filter layers 42a, 42b and 42c. The lens layers 44 may comprise any of several optically transparent lens materials that are known in the art. Non-limiting examples include optically transparent inorganic materials, optically transparent organic materials and optically transparent composite materials. Most common are optically transparent organic materials. Typically the lens layers 44 are formed incident to patterning and reflow of an organic polymer material that has a glass transition temperature lower than the series of color filter layers 42a, 42b and 42c or the planarizing layer 40. Other methods and materials may alternatively be used.

FIG. 6 shows a schematic cross-sectional diagram of a CMOS image sensor in accordance with an embodiment of the invention. The CMOS image sensor comprises the first region R1 comprising the plurality active pixels and the second region R2 comprising the dark pixel that includes the light shield 38". The CMOS image sensor also comprises the third region R3 that comprises circuitry including the first transistor T1 and the second transistor T2. The CMOS image sensor also comprises a multi-layer interconnect layer comprising the dielectric/contact stud layer 23, the dielectric/interconnect layer 27, the dielectric/stud-interconnect layer 31, the dielectric/terminal stud layer 35 and the interconnect layers 38. The multi-level interconnect layer comprises a first electrically active interconnect pattern P1''' within the first region R1 that comprises the active pixels and a second electrically active interconnect pattern P2''' spatially different from the first electrically active interconnect pattern P1''' within the second region R2 that comprises the dark pixel. The second electrically active interconnect pattern P2''' within the region R2 that comprises the dark pixel includes electrically active interconnect layer 29' and stud-interconnect layers 33' interposed between the light shield 38' and the photosensor region 14. The electrically active interconnect layer 29' and stud-interconnect layers 33' would otherwise be within a light path between the lens layer 44 and the photosensor region 14 within the second region R2 if the light shield 38' was absent. The use of these additional electrically active interconnect layer 29' and stud-interconnect layers 33' interposed between the light shield 38' and the photosensor region 14 within the second region R2 allows for design of additional circuitry within the CMOS image sensor at a location which is otherwise unused. Design and implementation of this additional circuitry also allows for the CMOS image sensor to be fabricated with a lesser number of metal levels. By using a lesser number of metal levels, a CMOS image sensor may be fabricated more efficiently and with less expenditure of manufacturing resource.

While the foregoing preferred embodiment illustrates the invention within the context of a CMOS image sensor comprising three interconnect metal levels (i.e., interconnect layers 29 and 29', stud-interconnect layers 33 and 33' and interconnect layers 38) the invention is clearly not limited to the foregoing embodiment. Rather an additional embodiment may comprise additional interconnect layers beyond the interconnect layers illustrated within the CMOS image sensor whose schematic cross-sectional diagram is illustrated in FIG. 6.

Figures 7, 8:
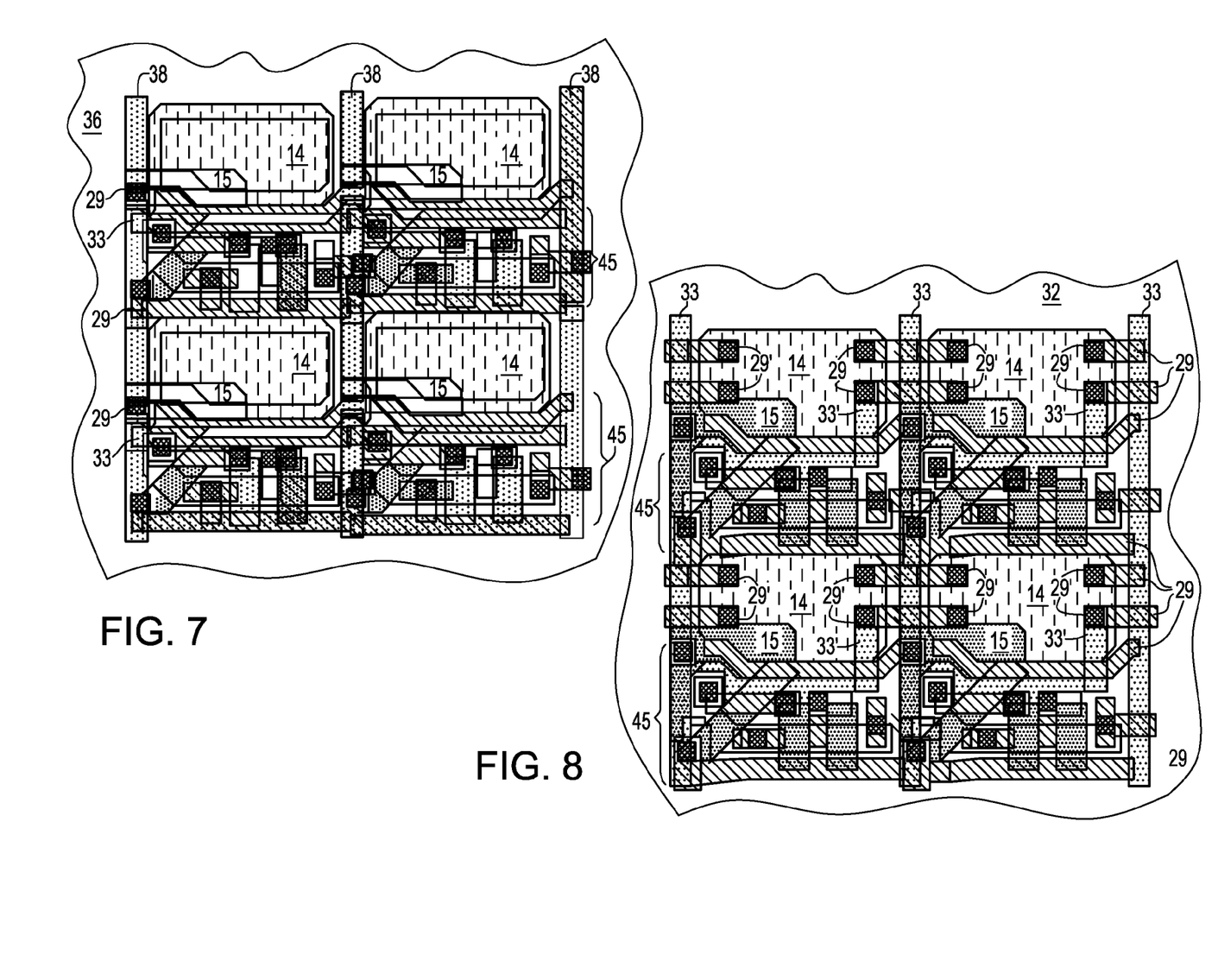
FIG. 7 and FIG. 8 show a pair of schematic plan-view diagrams illustrating an active pixel region and a dark pixel region generally in accordance with the embodiment of the invention that is illustrated within FIG. 1 to FIG. 6.

FIG. 7 and FIG. 8 show schematic plan-view diagrams illustrating an active pixel region generally, but not specifically, in accordance with the CMOS image sensor of FIG. 5 and a dark pixel region generally, but not specifically, in accordance with the CMOS image sensor of FIG. 4.

FIG. 7 shows a plurality of photosensor regions 14 illustrated in the foregoing cross-sectional diagrams and a plurality of transfer gates 15 that are not illustrated within the foregoing cross-sectional diagrams. FIG. 7 also shows a plurality of first interconnect layers 29, second interconnect layers 33 and third interconnect layers 38. FIG. 7 also shows dense interconnect regions 45. The plurality of photosensor regions 14 is largely exposed to an incoming light path.

FIG. 8 also shows the plurality of photosensor regions 14, transfer gates 15, first interconnect layers 29/29' and second interconnect layers 33/33'. Third interconnect layers that include light shields (such as the light shield 38' that is illustrated in FIG. 5) are omitted within FIG. 8. As is illustrated within the schematic plan-view diagram of FIG. 8, some portions of the first interconnect layers 29/29' (i.e., the portions designated as first interconnect layers 29') and the second interconnect layers 33/33' (i.e., the portions designated as second interconnect layers 33') intrude over the photodiode regions 14 and occupy light path space that may otherwise used for allowing light to be captured by the photosensor regions 14.

Thus, in accordance with description above, the plan-view diagrams of FIG. 7 and FIG. 8 also illustrate a CMOS image sensor in accordance with an embodiment of the invention. The CMOS image sensor includes electrically active interconnect layers 29' and 33' interposed between the light shield layers (not shown) and the photosensor regions 14 within dark pixel regions but not active pixel regions. These additional electrically active interconnect layers 29' and 33' that are within a light path with respect to photosensor regions 14 within the dark pixel region allow for greater functionality and fewer metal levels when fabricating a CMOS image sensor array. Thus use of fewer metal levels provides for enhanced manufacturing efficiency.

The preferred embodiments of the invention are illustrative of the invention rather than limiting of the invention. Revisions and modifications may be made to methods, materials, structures and dimensions of a CMOS image sensor in accordance with the preferred embodiments of the invention while still providing a CMOS image sensor in accordance with the invention, further in accordance with the accompanying claims.

What is claimed is:

1. A method for fabricating an image sensor comprising:
   forming a multi-layer interconnect layer over a substrate comprising a plurality of photosensor regions comprising a plurality of dark pixel regions and a plurality of active pixel regions, the multi-layer interconnect layer including a first electrically active pattern with respect to the plurality of active pixel regions and a second electrically active pattern spatially different from the first electrically active pattern with respect to the plurality of dark pixel regions, where the second electrically active pattern comprises at least one interconnect layer not included within the first electrically active pattern that would be spatially located in a light path if formed within the first electrically active pattern.

2. The method of claim 1 wherein the forming the multi-layer interconnect layer provides:
   a plurality of light shield layers aligned with the plurality of photosensor regions comprising the plurality of dark pixels; and
   a plurality of electrically active interconnect layers interposed between the plurality of light shield layers and the plurality photosensor regions comprising the plurality of dark pixels.

3. The method of claim 1 further comprising:
   forming a plurality of lens layers over the multi-layer interconnect layer and aligned with the plurality of photosensor regions.

4. The method of claim 1 further comprising: forming a plurality of color filter layers over the multi-layer interconnection layer and aligned with the plurality of photosensor regions.

5. The method of claim 1 wherein the plurality of photosensor regions comprises a plurality of charge coupled devices.

6. The method of claim 1 wherein the plurality of photosensor regions comprises a plurality of photodiodes.

7. The method of claim 1 wherein the forming the multi-layer interconnection layer uses a semiconductor substrate.

* * * * *